(12) United States Patent
Liu

(10) Patent No.: US 8,050,058 B2
(45) Date of Patent: Nov. 1, 2011

(54) SWITCH APPARATUS AND ELECTRONIC DEVICE USING THE SAME

(75) Inventor: Gang-Hua Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 298 days.

(21) Appl. No.: 12/496,649

(22) Filed: Jul. 2, 2009

(65) Prior Publication Data
US 2010/0039790 A1 Feb. 18, 2010

(30) Foreign Application Priority Data
Aug. 15, 2008 (CN) .......................... 2008 1 0303863

(51) Int. Cl.
*H02J 7/00* (2006.01)
(52) U.S. Cl. ........ 361/837; 361/632; 361/747; 320/114; 200/336; 200/337
(58) Field of Classification Search .................. 361/632, 361/728, 730, 732, 726, 747, 752, 837; 200/336, 200/337; 320/114; 455/573, 574, 575.1
See application file for complete search history.

(56) References Cited

U.S. PATENT DOCUMENTS

| | | | | |
|---|---|---|---|---|
| 5,057,824 A | * | 10/1991 | Stokes | 455/127.1 |
| 6,141,569 A | * | 10/2000 | Weisshappel et al. | 455/572 |
| 7,711,401 B2 | * | 5/2010 | Lim | 455/575.8 |

\* cited by examiner

*Primary Examiner* — Dameon Levi
(74) *Attorney, Agent, or Firm* — Altis Law Group, Inc.

(57) ABSTRACT

A switch apparatus and an electronic device using the switch apparatus are provided. The switch apparatus includes a first transmitting element, a second transmitting element, an elastic element, and a linkage pole located in the interior space of the electronic device and a slidable actuator mounted above an aperture defined in the electronic device. The slidable actuator is movable along the aperture between a first position and a second position. The first transmitting element is elastically supported by the elastic element and electrically coupled to an electronic board of the electronic device. The second transmitting element is electrically coupled to batteries received in the electronic device. The movement of the slidable actuator from the first position to the second position pushes the linkage pole, causing the linkage pole to move the first transmitting element and separate the first transmitting element from the second transmitting element.

10 Claims, 7 Drawing Sheets

SWITCH APPARATUS AND ELECTRONIC DEVICE USING THE SAME

BACKGROUND

1. Technical Field

The disclosure relates to switch apparatuses and electronic devices employing the switch apparatuses, and especially, to electronic devices powered by batteries and switch apparatuses for controlling the connection of the batteries and electronic boards of the electronic devices.

2. Description of Related Art

Nowadays, batteries are usually used to power portable terminal devices, such as mobile phones, and portable computers. When a battery is mounted to an electronic device, the battery is coupled with an electronic board of the electronic device to provide power to the electronic board, so that the electronic board and the electronic device can operate. However, even if the electronic device has been powered off, the battery still discharges via the electronic board, which is a waste of power and reduces the service life of the battery.

BRIEF DESCRIPTION OF THE DRAWINGS

The components of the drawings are not necessarily drawn to scale, the emphasis instead being placed upon clearly illustrating the principles of a switch apparatus and an electronic device using the same. Moreover, in the drawings, like reference numerals designate corresponding parts throughout several views.

DETAILED DESCRIPTION

Figure 1:
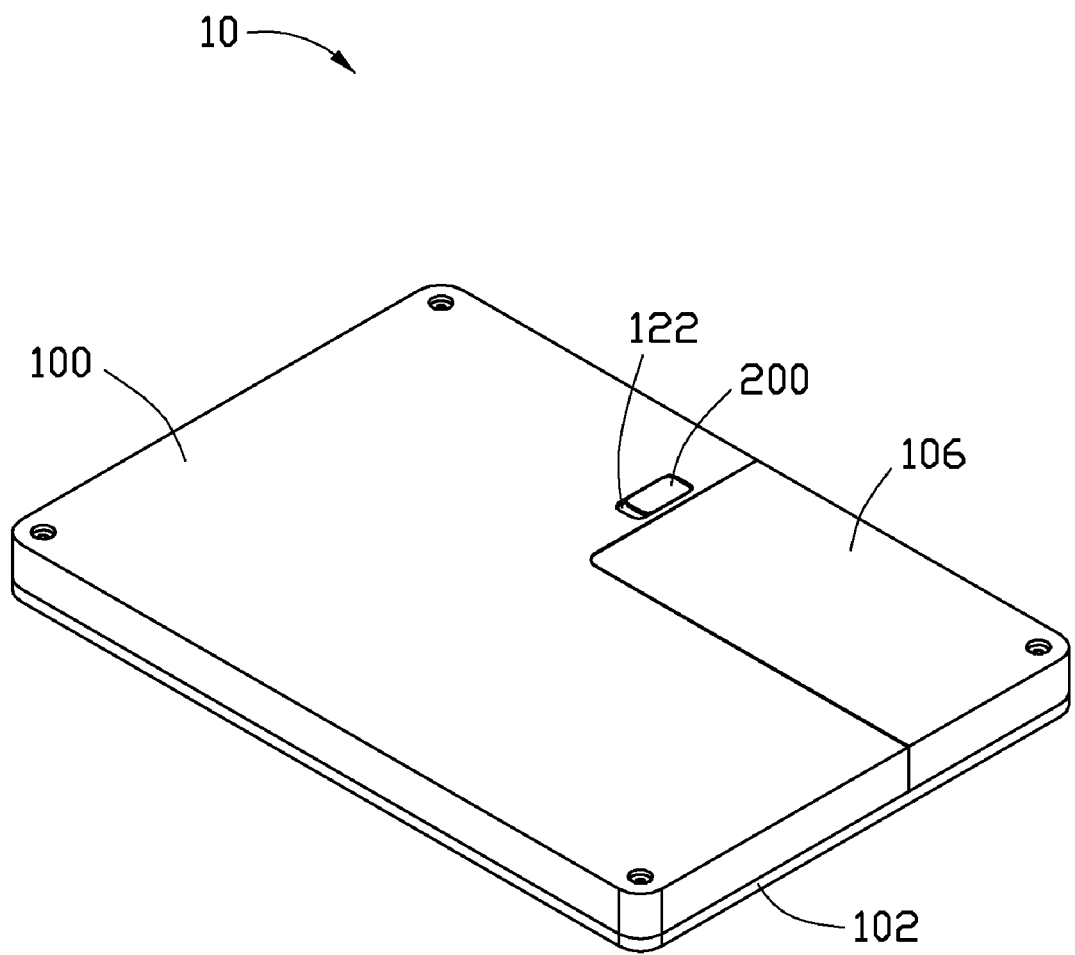
FIG. 1 is an isometric view of an electronic device in accordance with one embodiment, showing a battery cavity of the electronic device located in the back of the electronic device.
Figure 2:
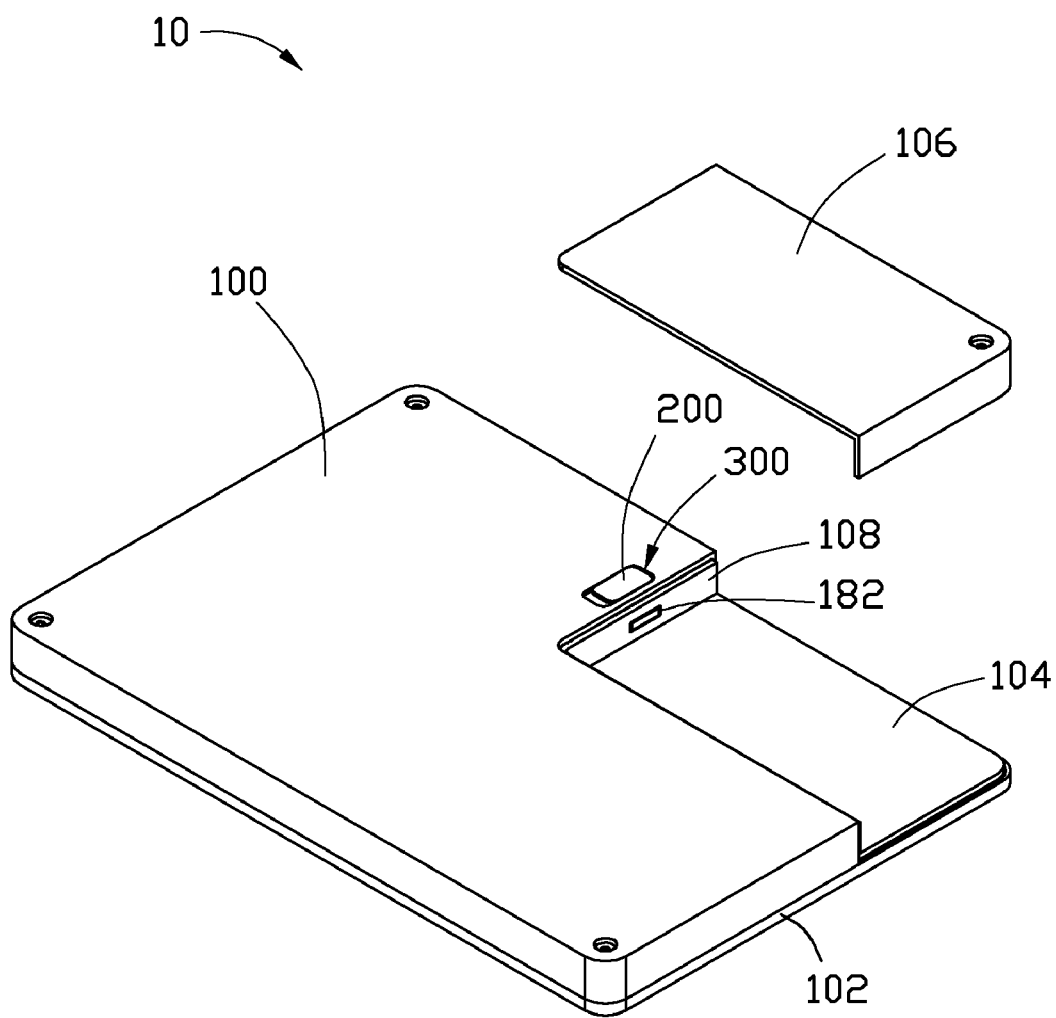
FIG. 2 is a perspective view of the electronic device of FIG. 1, showing a battery lid of electronic device removed from the battery cavity.

Referring to FIG. 1 and FIG. 2, an electronic device 10 includes a first casing 100 and a second casing 102. The second casing 102 is secured to the first casing 100 to form an interior space for containing components (not shown) of the electronic device 10. A battery cavity 104 for receiving one or more batteries is located in the back of the first casing 100. The battery cavity 104 is covered by a removable battery lid 106. A through hole 182 penetrates through a sidewall 108 of the battery cavity 104. A switch apparatus 300 is located adjacent to the sidewall 108. The switch apparatus 300 has a slidable actuator 200 extending out of the first casing 100 of the electronic device 10.

Figure 3:
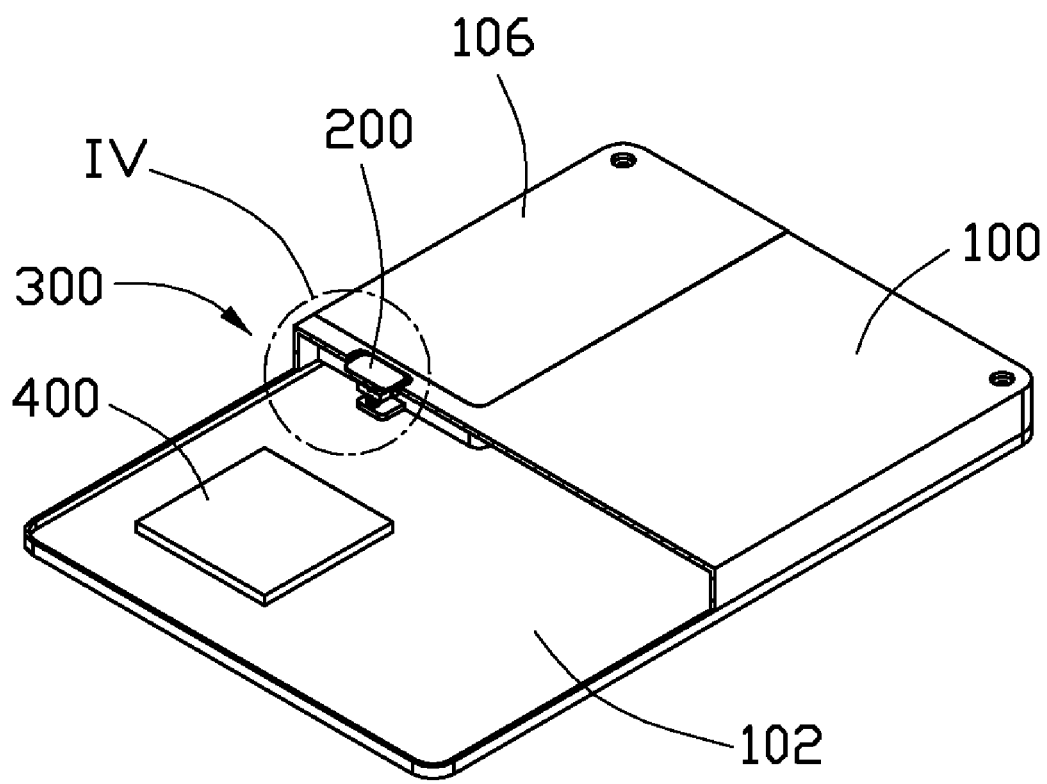
FIG. 3 is a partially cutaway perspective view of the electronic device of FIG. 1.
Figure 4:
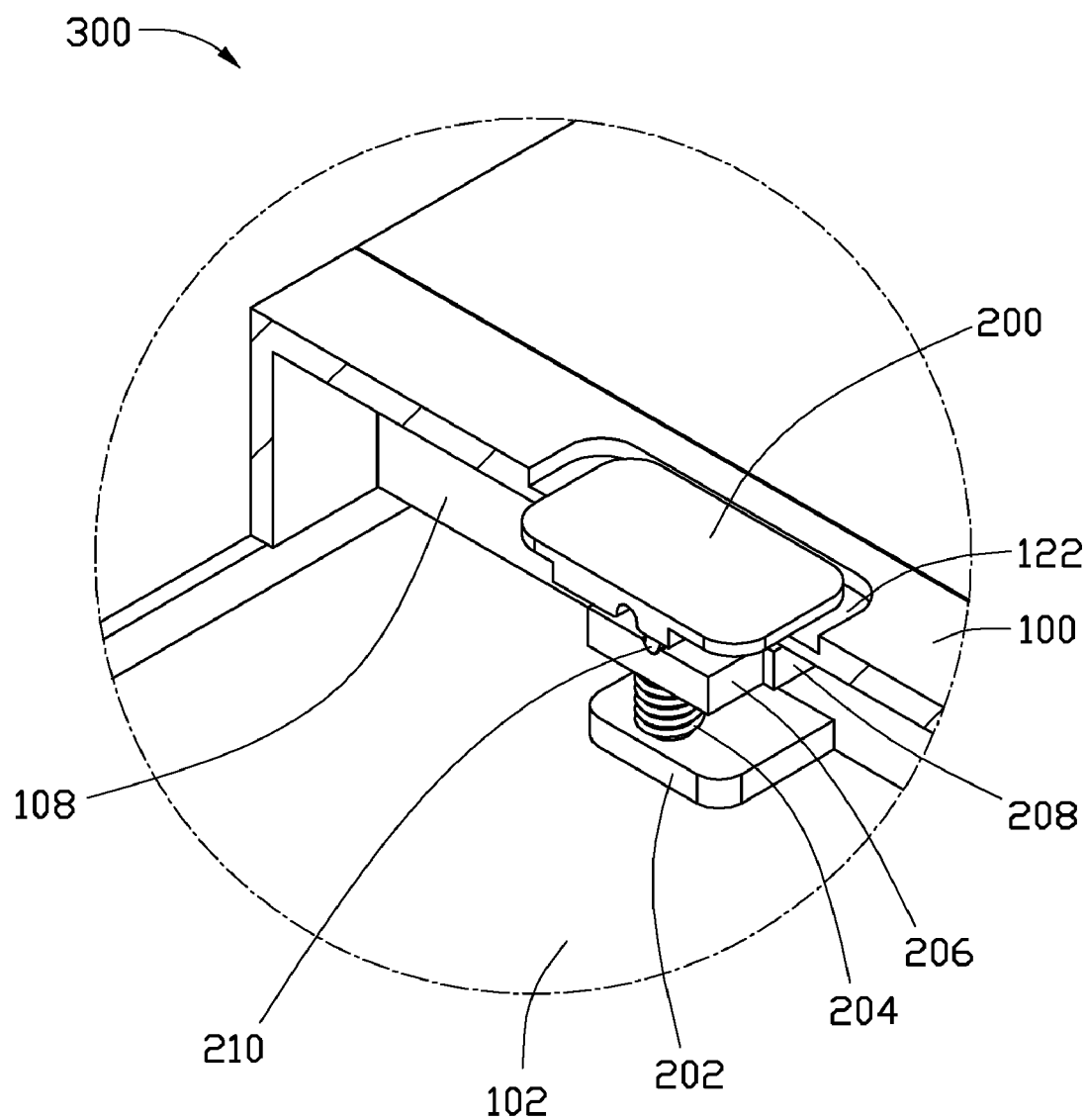
FIG. 4 is an enlarged perspective view of one embodiment of a switch apparatus of the electronic device of FIG. 3.
Figure 5:
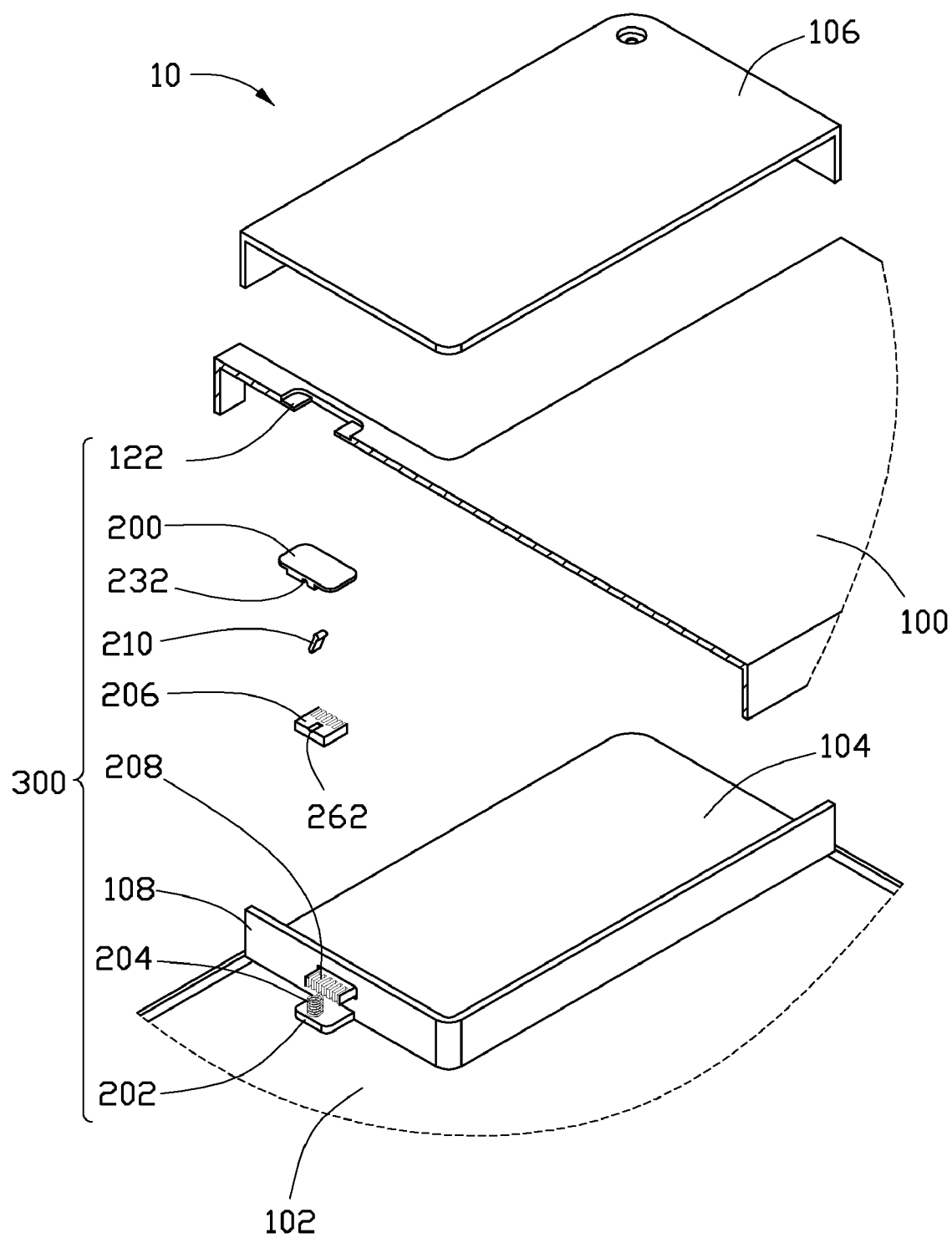
FIG. 5 is an exploded perspective view of the electronic device of FIG. 3.

Referring also to FIGS. 3-5, an aperture 122 is defined in the first casing 100. In one embodiment, the aperture 122 is substantially rectangular shaped. The aperture 122 is adjacent to the sidewall 108. The switch apparatus 300 includes a retaining board 202 which is fixed on the second casing 102 and faces towards the aperture 122. A first transmitting element 206 is elastically attached to the retaining board 202 via an elastic element 204 and supported by the retaining board 202 via the elastic element 204. In one embodiment, the elastic element 205 is a spring which is attached to the first transmitting element 206 and the retaining board 202 at opposite ends of the spring. The first transmitting element 206 is electrically coupled to a second transmitting element 208 which extends through the hole 182 and is electrically coupled to the batteries received in the battery cavity 106. The first transmitting element 206 is further electrically connected to an electronic board 400 of the electronic device 10. The slidable actuator 200 is moveable along the aperture 122. The slidable actuator 200 has a rear facing towards the aperture 122. A first rotary groove 232 is defined in the rear of the slidable actuator 200. The first transmitting element 206 has a front facing towards the aperture 122. A second rotary groove 262 is defined in the front of the first transmitting element 206. A linkage pole 210 is held between the first rotary groove 232 and the second rotary groove 262. The linkage pole 210 has an end pivotally received in the first rotary groove 232, and an opposite end pivotally received in the second rotary groove 262.

Figure 6:
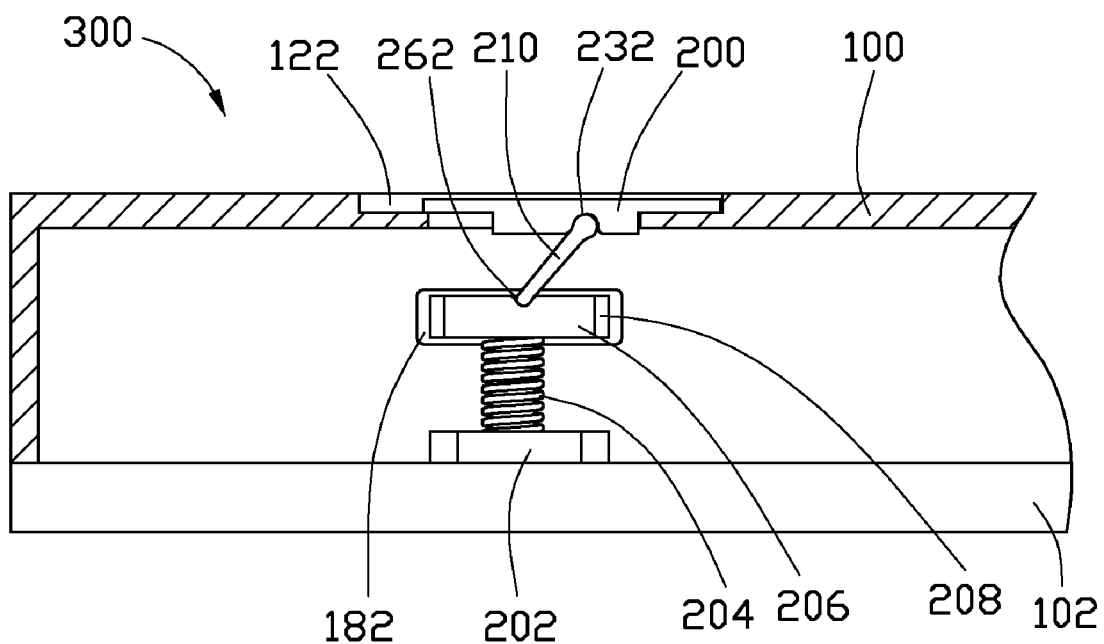
FIG. 6 is a cross-sectional view of the switch apparatus of FIG. 3, showing the switch apparatus in a closed state.
Figure 7:
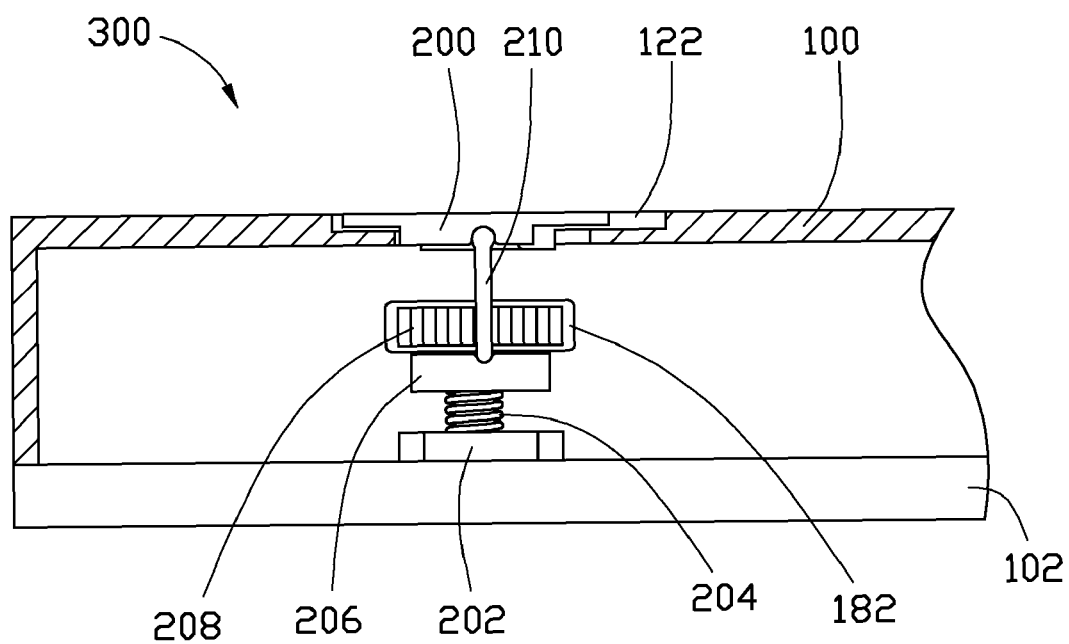
FIG. 7 is cross-sectional view of the switch apparatus of FIG. 3, showing the switch apparatus in an opened state.

Referring to FIG. 6, the slidable actuator 200 is in a first position and the switch apparatus 300 is in a closed state. The linkage pole 210 is slanted relative to the slidable actuator 200 and the first transmitting element 206. The first transmitting element 206 is held up by the elastic element 204 to be coupled with the second transmitting element 208. In FIG. 7, the slidable actuator 200 has been moved to a second position and the switch apparatus 300 is in an opened state. While sliding the sliding block 200, the linkage pole 210 is forced to push the first transmitting element 206 downwardly until the first transmitting element 206 is separated from the second transmitting element 208.

Therefore, while the electronic device 10 is in use, the slidable actuator 200 is kept at the first position, and the first transmitting element 206 is coupled with the second transmitting element 208, such that the electronic board 400 of the electronic device 10 obtains power from the batteries. If the electronic device 10 has been powered off, users can slide the slidable actuator 200 to the second position to cut off the electrical connection between the batteries and the electronic board 400, thereby cutting off the discharge path of the batteries.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. A switch apparatus applied in an electronic device comprising a first casing and a second casing coupled together to form an interior space, and defining an aperture, and a battery cavity to receive one or more batteries to power an electronic board of the electronic device, the switch apparatus comprising:

a first transmitting element;
a second transmitting element;
an elastic element;
a linkage pole located in the interior space of the electronic device; and
a slidable actuator mounted above the aperture defined in the first casing of the electronic device;
wherein the slidable actuator is movable along the aperture between a first position and a second position; the first transmitting element is elastically supported by the elastic element and electrically coupled to the electronic board of the electronic device; the second transmitting element is electrically coupled to the batteries received in the battery cavity of electronic device; the movement of the slidable actuator from the first position to the second position pushes the linkage pole, causing the linkage pole to move the first transmitting element and separate the first transmitting element from the second transmitting element.

2. The switch apparatus as described in claim 1, wherein a first groove is defined in a front of the first transmitting element; the linkage pole has an end pivotally received in the first groove.

3. The switch apparatus as described in claim 2, wherein a second groove is defined in a rear of the slidable actuator; the linkage pole has an opposite end pivotally received in the second groove.

4. The switch apparatus as described in claim 1, wherein the elastic element is a spring.

5. The electronic device as described in claim 1, further comprising a retaining board mounted on the second casing of the electronic device; the first transmitting element is attached to the retaining board via the elastic element.

6. An electronic device comprising:
 a first casing;
 a second casing coupled to the first casing to form an interior space of the electronic device;
 an electronic board;
 a battery cavity to receive one or more batteries to power the electronic board;
 an elastic element;
 a first transmitting element;
 a second transmitting element;
 a linkage pole located in the interior space of the electronic device; and
 a slidable actuator mounted above the first casing of the switch apparatus;
 wherein an aperture is defined in the first casing; the slidable actuator is movably mounted above the aperture and is moveable along the aperture between a first position and a second position; the first transmitting element is elastically supported by the elastic element and electrically connected to the electronic board; a through hole is defined in a sidewall of the battery cavity; and the second transmitting element extends through the through hole to be electrically coupled to the batteries received in the battery cavity; the movement of the slidable actuator from the first position to the second position pushes the linkage pole, causing the linkage pole to move the first transmitting element and separate the first transmitting element from the second transmitting element.

7. The electronic device as described in claim 6, wherein a first groove is defined in a front of the first transmitting element; the linkage pole has an end pivotally received in the first groove.

8. The electronic device as described in claim 7, wherein a second groove is defined in a rear of the slidable actuator; the linkage pole has an opposite end pivotally received in the second groove.

9. The electronic device as described in claim 6, wherein the elastic element is a spring.

10. The electronic device as described in claim 6, further comprising a retaining board mounted on the second casing of the electronic device; the first transmitting element is attached to the retaining board via the elastic element.

\* \* \* \* \*